(12) United States Patent
Kim et al.

(10) Patent No.: US 11,515,350 B2
(45) Date of Patent: Nov. 29, 2022

(54) MULTICOLOR PHOTODETECTOR AND METHOD FOR FABRICATING THE SAME BY INTEGRATING WITH READOUT CIRCUIT

(71) Applicant: Korea Advanced Institute of Science and Technology, Daejeon (KR)

(72) Inventors: Sanghyeon Kim, Daejeon (KR); Dae-Myeong Geum, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 304 days.

(21) Appl. No.: 16/860,924

(22) Filed: Apr. 28, 2020

(65) Prior Publication Data

US 2020/0381471 A1 Dec. 3, 2020

(30) Foreign Application Priority Data

May 30, 2019 (KR) .......................... 10-2019-0063768
Mar. 2, 2020 (KR) .......................... 10-2020-0026033

(51) Int. Cl.
*H01L 27/146* (2006.01)
*H04N 5/378* (2011.01)
*H04N 9/04* (2006.01)

(52) U.S. Cl.
CPC .... *H01L 27/14634* (2013.01); *H01L 27/1469* (2013.01); *H01L 27/14621* (2013.01);
(Continued)

(58) Field of Classification Search
CPC ...... H04N 5/378; H04N 5/379; H04N 9/0455; H04N 9/04563; H01L 27/1462;
(Continued)

(56) References Cited

U.S. PATENT DOCUMENTS 4,677,289 A * 6/1987 Nozaki ................... H01L 31/06
250/208.2
6,184,538 B1 * 2/2001 Bandara ................ H01L 31/11
438/66
(Continued)

FOREIGN PATENT DOCUMENTS

JP 2002-503877 2/2002
JP 2003-142721 5/2003
(Continued)

*Primary Examiner* — Lin Ye
*Assistant Examiner* — Chriss S Yoder, III
(74) *Attorney, Agent, or Firm* — Blank Rome LLP

(57) ABSTRACT

Provided are a multicolor photodetector and a method of fabricating the same through integration with a readout integrated circuit. The multicolor photodetector may be fabricated by providing an integrated circuit device in which a readout integrated circuit is wired; forming an assembly in which a first photodetection layer for detecting first wavelength light from incident light and a second photodetection layer for detecting second wavelength light from the incident light on the integrated circuit device; and electrically connecting the first photodetection layer and the second photodetection layer to the readout integrated circuit using connecting members.

18 Claims, 14 Drawing Sheets

(52) U.S. Cl.
CPC .. *H01L 27/14629* (2013.01); *H01L 27/14636* (2013.01); *H01L 27/14685* (2013.01); *H04N 5/378* (2013.01); *H04N 9/0455* (2018.08); *H04N 9/04563* (2018.08)

(58) Field of Classification Search
CPC ......... H01L 27/14621; H01L 27/14629; H01L 27/14634; H01L 27/14636; H01L 27/14647; H01L 27/14685; H01L 27/1469
See application file for complete search history.

(56) References Cited

U.S. PATENT DOCUMENTS

| | | | |
|---|---|---|---|
| 9,184,198 B1* | 11/2015 | Miao | H01L 27/14621 |
| 2004/0259010 A1* | 12/2004 | Kanbe | H01L 27/14647 |
| | | | 257/E27.135 |
| 2015/0163403 A1* | 6/2015 | Wakabayashi | H04N 5/3698 |
| | | | 348/308 |

FOREIGN PATENT DOCUMENTS

| | | |
|---|---|---|
| JP | 2004-031512 | 1/2004 |
| JP | 2006-173330 | 6/2006 |

* cited by examiner

MULTICOLOR PHOTODETECTOR AND METHOD FOR FABRICATING THE SAME BY INTEGRATING WITH READOUT CIRCUIT

CROSS-REFERENCE TO RELATED APPLICATION

This application claims the priority benefit of Korean Patent Application Nos. 10-2019-0063768, filed on May 30, 2019 and 10-2020-0026033, filed on Mar. 2, 2020, in the Korean Intellectual Property Office, the disclosure of which is incorporated herein by reference.

BACKGROUND

1. Field of the Invention

The following description of example embodiments relates to a multicolor photodetector and a method of fabricating the same through integration with a readout integrated circuit.

2. Description of the Related Art

In general, a photodetector serves to detect light with a predetermined wavelength from incident light and to convert the detected light to an electrical signal. An image associated with the incident light may be implemented based on the electrical signal converted by the photodetector. Currently, a photodetector capable of detecting light with multiple wavelengths, that is, multicolor light from incident light is designed with the intent of enhancing quality of the image associated with the incident light.

Such a photodetector may include a substrate, a first layer configured to detect first wavelength light and to convert the detected first wavelength light to an electrical signal and a second layer configured to detect second wavelength light and to convert the detected second wavelength light to an electrical signal. For example, the photodetector may be fabricated based on a growth scheme. That is, the photodetector may be fabricated by growing the first layer on the substrate and by growing the second layer on the first layer. However, the photodetector of the above example may have a relatively thick thickness and complex structure and may require a complex growth scheme. As another example, the photodetector may be fabricated based on a heterogeneous integration scheme. That is, the first layer and the second layer are individually fabricated and then provided vertically or horizontally on the substrate. However, in the case of the photodetector of the other example, it is difficult to arrange each of the first layer and the second layer at a preset position on the substrate.

SUMMARY

Example embodiments provide an easily fabricable multicolor photodetector and a method of fabricating the multicolor photodetector.

Example embodiments also provide a multicolor photodetector having enhanced operation accuracy and a method of fabricating the multicolor photodetector.

According to an aspect of example embodiments, there is provided a method of fabricating a multicolor photodetector, the method including: providing an integrated circuit device in which a readout integrated circuit is wired; forming an assembly in which a first photodetection layer for detecting first wavelength light from incident light and a second photodetection layer for detecting second wavelength light from the incident light are formed on the integrated circuit device; and electrically connecting the first photodetection layer and the second photodetection layer to the readout integrated circuit using connecting members.

According to an aspect of example embodiments, there is provided a multicolor photodetector including an integrated circuit device in which a readout integrated circuit is wired; at least one photodetection device including a first photodetection layer provided on the integrated circuit device and configured to detect first wavelength light from incident light, and a second photodetection layer stacked on the first photodetection layer and configured to detect second wavelength light from the incident light; and connecting members configured to electrically connect the first photodetection layer and the second photodetection layer to the readout integrated circuit.

According to some example embodiments, a multicolor photodetector may be implemented by integrating a first photodetection layer and a second photodetection layer on an integrated circuit device. Through this, a structure of the first photodetection layer and the second photodetection layer may be simplified. Here, the first photodetection layer and the second photodetection layer may be formed on the integrated circuit device according to a semiconductor fabrication scheme. Through this, a method of fabricating the multicolor photodetector may be simplified. Accordingly, the multicolor photodetector may be easily fabricated. In addition, the first photodetection layer and the second photodetection layer may be cut on the integrated circuit device and thus, may be accurately arranged based on a pixel structure. Accordingly, an operation accuracy of the multicolor photodetector may be enhanced.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
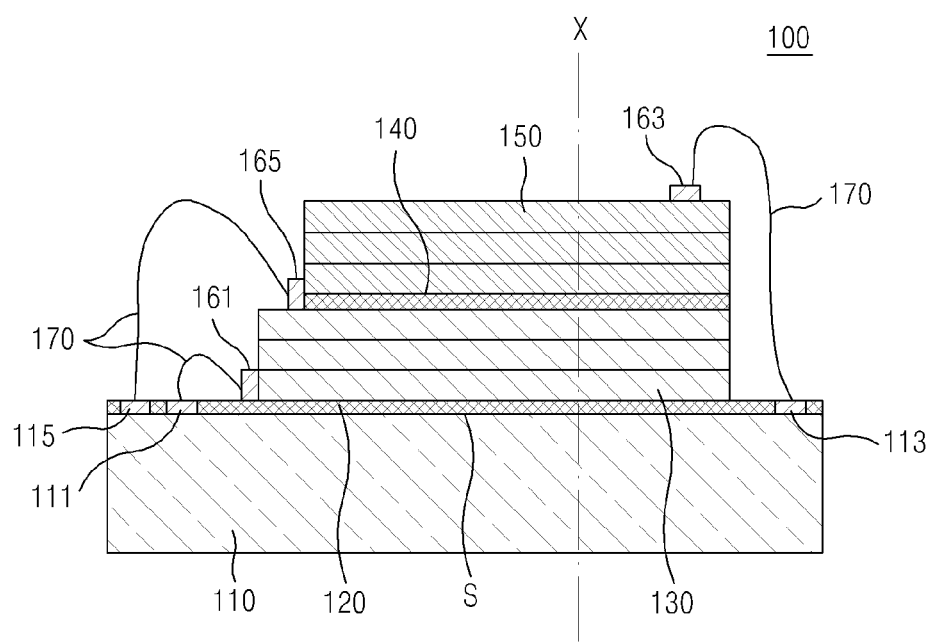
FIG. 1 is a cross-sectional view illustrating a multicolor photodetector according to first example embodiments.

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments.

When a component is described to be on another component, the component may be directly formed on the other component or a third component may be provided between the components. Also, in the drawings, thicknesses of components may be exaggerated to effectively describe technical content. Unless otherwise noted, like reference numerals refer to like components throughout the attached drawings and written description, and thus descriptions will not be repeated.

The example embodiments described herein will be described with the accompanying drawings. In the drawings, thicknesses of layers, regions, etc., may be exaggerated for effective description of the technical content. Accordingly, regions illustrated in the drawings may have general attributes and shapes of the regions are merely provided as examples and not construed to limit the scope of the disclosure.

Hereinafter, various example embodiments are described with reference to the accompanying drawings.

FIG. 1 is a cross-sectional view illustrating a multicolor photodetector 100 according to first example embodiments.

Referring to FIG. 1, the multicolor photodetector 100 may include at least one of an integrated circuit (IC) device 110, a first attachment layer 120, a first photodetection layer 130, a second attachment layer 140, a second photodetection layer 150, and a plurality of connecting members 170. Here, the multicolor photodetector 100 may include at least one photodetection device provided in a pixel structure and configured to constitute each pixel. Here, the first photodetection layer 130, the second attachment layer 140, and the second photodetection layer 150 may be configured as a single photodetection device.

The integrated circuit device 110 may detect a sensing signal from each of the first photodetection layer 130 and the second photodetection layer 150. In response to the sensing signal, the integrated circuit device 110 may implement an image. To this end, the integrated circuit device 110 may include a readout integrated circuit (ROIC) (not shown) and a plurality of pads 111, 113, and 115. The ROIC may be wired in the integrated circuit device 110. Each of the pads 111, 113, and 115 may be provided on one surface S of the integrated circuit device 110 and may be connected to the ROIC. The pads 111, 113, and 115 may include the first pad 111, the second pad 113, and the third pad 115. Herein a single axis X that passes through the one surface S of the integrated circuit device 110 may be defined. For example, the one surface S of the integrated circuit device 110 may be provided on a plane perpendicular to the axis X.

The first attachment layer 120 may protect the surface of the integrated circuit device 110. The first attachment layer 120 may attach the first photodetection layer 130 to the integrated circuit device 110. To this end, the first attachment layer 120 may be provided on the one surface S of the integrated circuit device 110. Here, the first attachment layer 120 may expose the pads 111, 113, and 115 on the one surface S of the integrated circuit device 110. For example, the first attachment layer 120 may include a plurality of apertures configured to expose the pads 111, 113, and 115. The apertures may pass through the first attachment layer 120 in a direction parallel to the axis X.

The first photodetection layer 130 may detect first wavelength light from incident light. For example, the first wavelength light may be at least one of ultraviolet (UV) light, visible light, and infrared (IR) light. Accordingly, the first photodetection layer 130 may generate a sensing signal for the first wavelength light. The first photodetection layer 130 may be formed on the one surface S of the integrated circuit device 110. Here, the first photodetection layer 130 may be attached to the first attachment layer 120. That is, the first photodetection layer 130 may be stacked on the integrated circuit device 110 in a direction parallel to the one axis X through the first attachment layer 120. The first photodetection layer 130 may expose the pads 111, 113, and 115 on the one surface S of the integrated circuit device 110. To this end, the first photodetection layer 130 may be provided to occupy only a partial area of the one surface S of the integrated circuit device 110. For example, the first photodetection layer 130 may include an n-type semiconductor layer adjacent to the one surface S of the integrated circuit device 110 and a p-type semiconductor layer stacked on the n-type semiconductor layer in a direction parallel to the one axis X. For example, the first photodetection layer 130 may further include a intrinsic semiconductor layer provided between the n-type semiconductor layer and the p-type semiconductor layer.

The second attachment layer 140 may couple the first photodetection layer 130 and the second photodetection layer 150. The second attachment layer 140 may attach the first photodetection layer 130 and the second photodetection layer 150 to each other. Here, the second attachment layer 140 may be provided to face the integrated circuit device 110 along the one axis X based on the first photodetection layer 130. The second attachment layer 140 may be provided to face the first attachment layer 120 based on the first photodetection layer 130.

The second photodetection layer 150 may detect second wavelength light from the incident light. For example, the second wavelength light may be at least one of UV light, visible light, and IR light, aside from that of the first wavelength light. Accordingly, the second photodetection layer 150 may generate a sensing signal for the second wavelength light. The second photodetection layer 150 may be stacked on the first photodetection layer 130. Here, the second photodetection layer 150 may be stacked on the first photodetection layer 130 in a direction parallel to the one axis X. To this end, the second photodetection layer 150 may be attached to the second attachment layer 140. That is, the second photodetection layer 150 may be stacked on the first photodetection layer 130 through the second attachment layer 140. Here, if an area is defined in a direction perpendicular to the one axis X, an area of the second photodetection layer 150 may be identical to an area of the first photodetection layer 130 or may be less than the area of the first photodetection layer 130. For example, the second photodetection layer 150 may include a p-type semiconductor layer adjacent to the first photodetection layer 130 and an n-type semiconductor layer stacked on the p-type semiconductor layer in a direction parallel to the one axis X. For example, the second photodetection layer 150 may further include a intrinsic semiconductor layer provided between the p-type semiconductor layer and the n-type semiconductor layer.

According to the first example embodiments, the first photodetection layer 130, the second attachment layer 140, and the second photodetection layer 150 may be configured as a single photodetection device. Here, the photodetection device may be formed on the integrated circuit device 110 through the first attachment layer 120. The photodetection device may include a first electrode 161, a second electrode 163, and a third electrode 165.

The first electrode 161 may be provided to the first photodetection layer 130, the second electrode 163 may be provided to the second photodetection layer 150, and the third electrode 165 may be provided to be shared between the first photodetection layer 130 and the second photodetection layer 150. For example, the first electrode 161 may be provided to the n-type semiconductor layer of the first photodetection layer 130, the second electrode 163 may be provided to the n-type semiconductor layer of the second photodetection layer 150, and the third electrode 165 may be provided to be shared between the p-type semiconductor layer of the first photodetection layer 130 and the p-type semiconductor layer of the second photodetection layer 150. Through this, the first photodetection layer 130 may output a sensing signal for the first wavelength light through the first electrode 161 and the third electrode 165, and the second photodetection layer 150 may output a sensing signal for the second wavelength light through the second electrode 163 and the third electrode 165. The first electrode 161, the second electrode 163, and the third electrode 165 may be exposed to the outside and may be provided to be adjacent to the pads 111, 113, and 115 of the integrated circuit device 110, respectively.

The connecting members 170 may electrically connect the first photodetection layer 130 and the second photodetection layer 150 to the ROIC of the integrated circuit device 110. The connecting members 170 may forward the sensing signal from each of the first photodetection layer 130 and the second photodetection layer 150 to the ROIC of the integrated circuit device 110. To this end, the connecting members 170 may connect the first electrode 161 and the first pad 111, may connect the second electrode 163 and the second pad 113, and may connect the third electrode 165 and the third pad 115. Here, the connecting members 170 may include, for example, a metal wire.

FIGS. 2A and 2B, 3, 4, 5A and 5B, and 6A and 6B illustrate a method of fabricating the multicolor photodetector 100 according to the first example embodiments.

Referring to FIGS. 2A and 2B, 3, 4, 5A and 5B, and 6A and 6B, the multicolor photodetector 100 according to the first example embodiments may be fabricated based on a semiconductor fabrication scheme. That is, the integrated circuit device 110 including the ROIC may be prepared and the first photodetection layer 130 and the second photodetection layer 150 may be formed on the integrated circuit device 110. The integrated circuit device 110 may electrically connect to first photodetection layer 130 and the second photodetection layer 150.

Figure 2A:
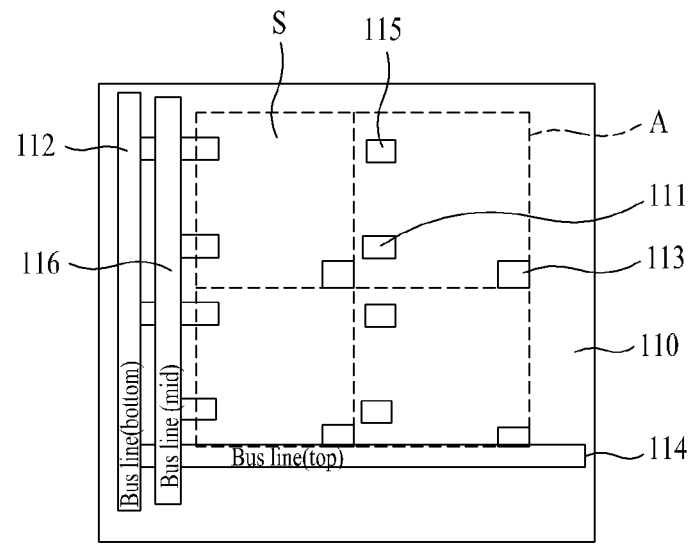
FIGS. 2A and 2B, 3, 4, 5A and 5B, and 6A and 6B illustrate a method of fabricating the multicolor photodetector according to the first example embodiments.
Figure 2B:
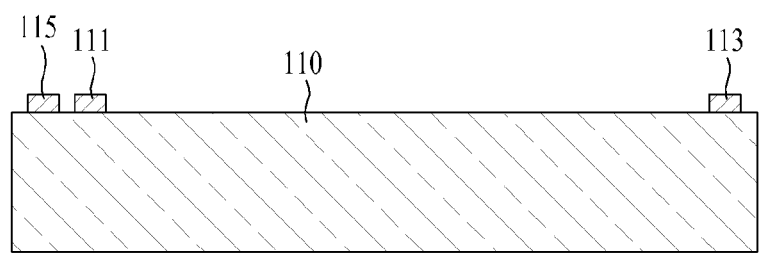

Referring to FIGS. 2A and 2B, the integrated circuit device 110 may be provided. Here, the integrated circuit device 110 may be provided as a wafer. The integrated circuit device 110 may be configured to receive a sensing signal from an outside and to implement an image in response to the sensing signal. To this end, the integrated circuit device 110 may include the ROIC. The ROIC may be wired in the integrated circuit device 110. The integrated circuit device 110 may be provided in a pixel structure. The one surface S of the integrated circuit device 110 may be divided into a plurality of pixel areas A arranged in the pixel structure. For example, the pixel areas A may be arranged in a predetermined manner. Here, the one axis X that penetrates the one surface S of the integrated circuit device 110 may be defined. For example, the one surface S of the integrated circuit device 110 may be provided on a plane perpendicular to the one axis X.

The integrated circuit device 110 may include the plurality of pads 111, 113, and 115 and a plurality of buses 112, 114, and 116. The pads 111, 113, and 115 may be provided to receive a sensing signal from an outside. The pads 111, 113, and 115 may be provided on each of the pixel areas A on the one surface S of the integrated circuit device 110 and may connect to the ROIC. The pads 111, 113, and 115 may include the first pads 111, the second pads 113, and the third pads 115. The buses 112, 114, and 116 may be provided to output information about an image to the outside. Each of the buses 112, 114, and 116 may be provided separate from the pixel areas A on the one surface S of the integrated circuit device 110 and may connect to the ROIC. The buses 112, 114, and 116 may include the first bus 112, the second bus 114, and the third bus 116. Each of the first bus 112, the second bus 114, and the third bus 116 may connect to the first pads 111, the second pads 113, and the third pads 115 through the ROIC.

Figure 3:
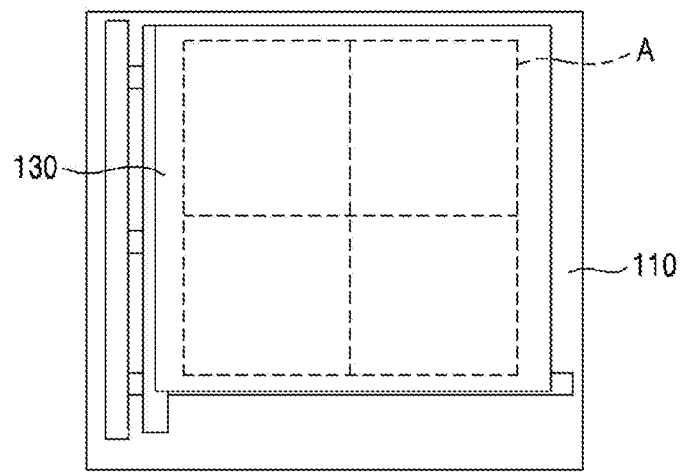
Figure 4:
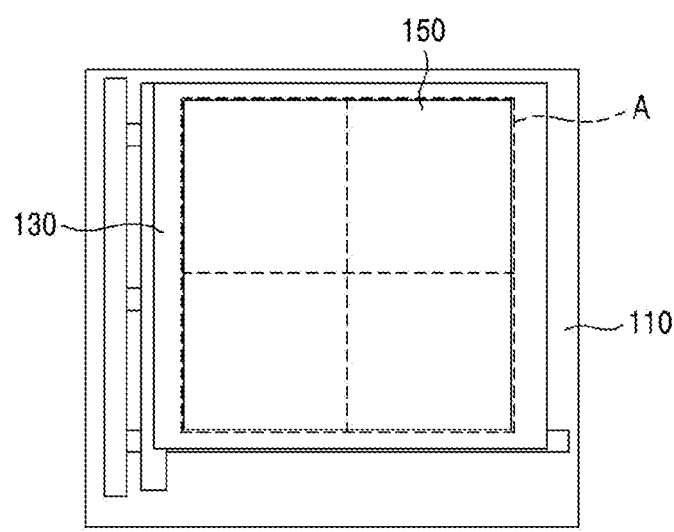

Referring to FIGS. 3 and 4, an assembly may be formed on the one surface S of the integrated circuit device 110. The assembly may be formed to cover all of the pixel areas A on the one surface S of the integrated circuit device 110. The assembly may include the first photodetection layer 130 and the second photodetection layer 150. The first photodetection layer 130 may be formed to detect first wavelength light from incident light and to generate a sensing signal for the first wavelength light, and the second photodetection layer 150 may be formed to detect second wavelength light from the incident light and to generate a sensing signal for the second wavelength light.

To this end, although it is not illustrated, the first attachment layer 120 may be formed on the integrated circuit device 110. The first attachment layer 120 may be provided on the one surface S of the integrated circuit device 110. Here, the first attachment layer 120 may expose the pads 111, 113, and 115 on the one surface S of the integrated circuit device 110. For example, the first attachment layer 120 may include a plurality of apertures configured to expose the pads 111, 113, and 115. The apertures may pass through the first attachment layer 120 in a direction parallel to the one axis X.

According to example embodiments, on the one surface S of the integrated circuit device 110, the first photodetection layer 130 may be formed and then the second photodetection layer 150 may be stacked. That is, referring to FIG. 3, the first photodetection layer 130 may be formed to cover all of the areas A on the one surface S of the integrated circuit device 110. Here, the first photodetection layer 130 may be attached to the first attachment layer 120. That is, the first photodetection layer 130 may be stacked on the integrated circuit device 110 in a direction parallel to the one axis X through the first attachment layer 120. Although not illustrated, the second attachment layer 140 may be formed to face the integrated circuit device 110 based on the first photodetection layer 130 along the one axis X. Here, the second attachment layer 140 may be formed to cover at least a portion of the first photodetection layer 130. Referring to FIG. 4, the second photodetection layer 150 may be stacked on the first photodetection layer 130 in a direction parallel to the one axis X. Here, the second photodetection layer 150 may be formed to cover all of the pixel areas A and at least a portion of the first photodetection layer 130 on the one surface S of the integrated circuit device 110. Here, the second photodetection layer 150 may be attached to the second attachment layer 140.

According to another example embodiment, although not illustrated, the assembly may be formed by stacking the first photodetection layer 130 and the second photodetection layer 150 and then may be attached on the one surface S of the integrated circuit device 110. That is, the first photodetection layer 130 may be prepared. Here, if an area is defined in a direction perpendicular to the one axis X, an area of the first photodetection layer 130 may be greater than or equal to an area of the pixel areas A on the one surface S of the integrated circuit device 110. The second attachment layer 140 may be formed on the first photodetection layer 130. Here, the second attachment layer 140 may be formed to cover at least a portion of the first photodetection layer 130. The second photodetection layer 150 may be stacked on the first photodetection layer 130. Here, the second photodetection layer 150 may be attached to the second attachment layer 140 and thereby stacked on the first photodetection layer 130. In this manner, the assembly may be formed. The assembly may be attached to the first attachment layer 120. That is, the assembly may be stacked on the integrated circuit device 110 in a direction parallel to the one axis X through the first attachment layer 120. Through this, the first photodetection layer 130 may be stacked on the integrated circuit device 110 and the second photodetection layer 150 may be stacked on the first photodetection layer 130, in a direction parallel to the one axis X.

Figure 5A:
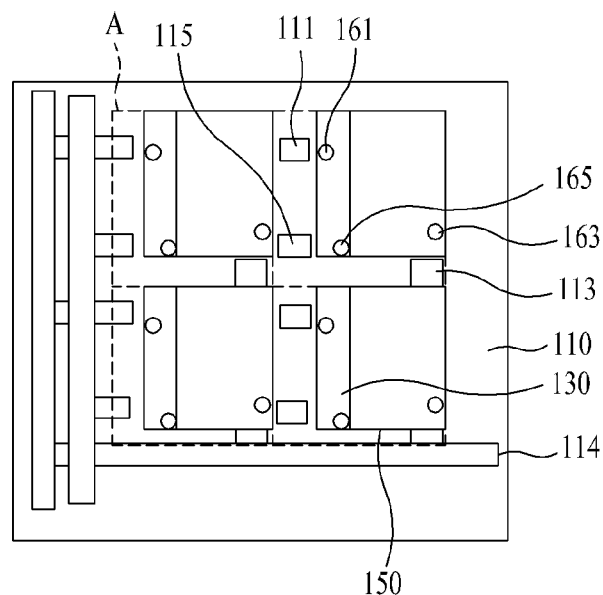
Figure 5B:
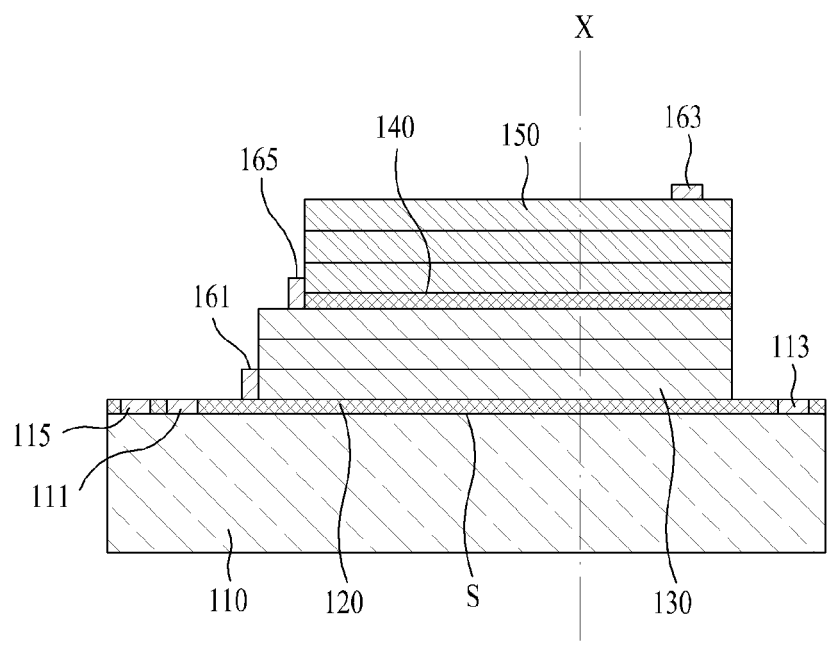

Further, referring to FIGS. 5A and 5B, at least one photodetection device may be defined by cutting the assembly. Here, in the pixel areas A, the assembly may be cut along a boundary between the pixel areas A. Here, the first photodetection layer 130, the second attachment layer 140, and the second photodetection layer 150 may be transmitted on the one surface S of the integrated circuit device 110. Through this, a single photodetection device may be provided to one of the pixel areas A. Here, the assembly may be divided into a plurality of photodetection devices to correspond to the pixel areas A. Accordingly, the photodetection devices may be arranged based on the pixel structure. In each of the pixel areas A, the pads 111, 113, and 115 of the integrated circuit device 110 and the first electrode 161, the second electrode 163, and the third electrode 165 of each photodetection device may be exposed. The first electrode 161 may be provided to the first photodetection layer 130, the second electrode 163 may be provided to the second photodetection layer 150, and the third electrode 165 may be provided to be shared between the first photodetection layer 130 and the second photodetection layer 150.

Figure 6A:
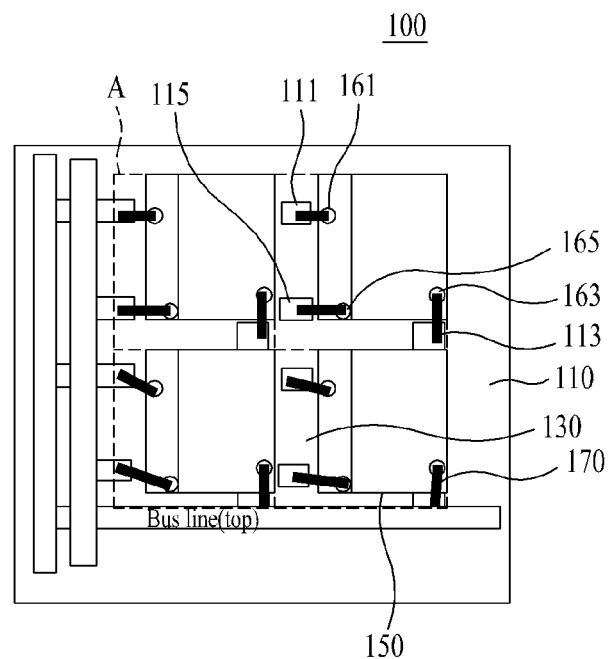
Figure 6B:
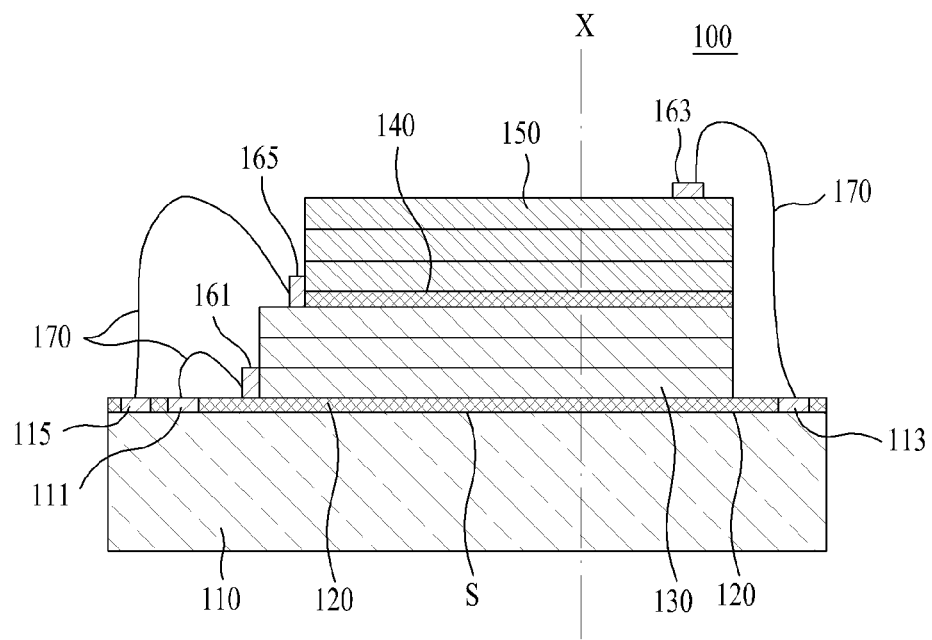

Referring to FIGS. 6A and 6B, the integrated circuit device 110 and the respective photodetection devices may be electrically connected using the respective corresponding connecting members 170. Here, the first photodetection layer 130 and the second photodetection layer 150 may be electrically connected to the ROIC of the integrated circuit device 110 using the connecting members 170. The first electrode 161 and the first pad 111 may be connected, the second electrode 163 and the second pad 113 may be connected, and the third electrode 165 and the third pad 115 may be connected. Here, the connecting members 170 may include, for example, a metal wire.

Through this, the multicolor photodetector 100 according to the first example embodiments may be fabricated. In response to an operation of the multicolor photodetector 100, the first photodetection layer 130 and the second photodetection layer 150 may detect the first wavelength light and the second wavelength light from the incident light, respectively. The first photodetection layer 130 and the second photodetection layer 150 may generate a sensing signal for the first wavelength light and the second wavelength light, respectively. The connecting members 170 may forward the sensing signal from the first photodetection layer 130 and the sensing signal from the second photodetection layer 150 to the ROIC of the integrated circuit device 110.

Figure 7:
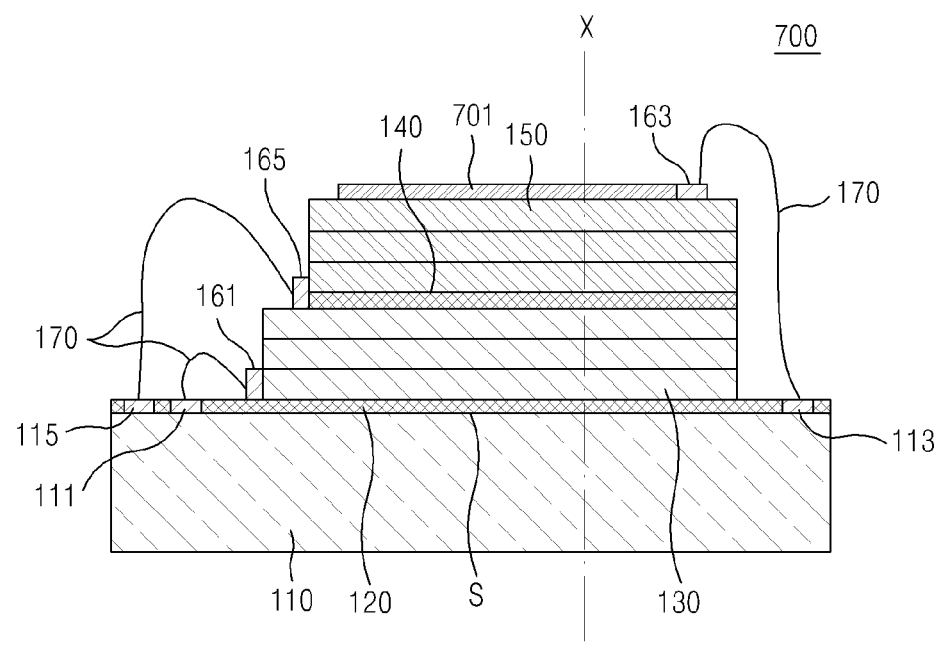
FIG. 7 is a cross-sectional view illustrating a multicolor photodetector according to second example embodiments.

FIG. 7 is a cross-sectional view illustrating a multicolor photodetector 700 according to second example embodiments.

Referring to FIG. 7, the multicolor photodetector 700 may include at least one of the integrated circuit device 110, the first attachment layer 120, the first photodetection layer 130, the second attachment layer 140, the second photodetection layer 150, the plurality of connecting members 170, and a filter layer 701. Here, the multicolor photodetector 700 may include at least one photodetection device provided in a pixel structure and configured to constitute each pixel. Here, the first photodetection layer 130, the second attachment layer 140, the second photodetection layer 150, and the filter layer 701 may be configured as a single photodetection device. Here, the integrated circuit device 110, the first attachment layer 120, the first photodetection layer 130, the second attachment layer 140, the second photodetection layer 150, and the connecting members 170 of FIG. 7 are identical to those of the multicolor photodetector 100 of FIG. 1. Therefore, further description related thereto is omitted.

The filter layer 701 may selectively transmit light with a wavelength corresponding to a predetermined band from incident light. In the filter layer 701, a band to be detected through each photodetection device may be determined. The filter layer 701 may be stacked on the second photodetection layer 150. However, it is provided as an example only. The filter layer 701 may be formed at least one of between the integrated circuit device 110 and the first photodetection layer 130, between the first photodetection layer 130 and the second photodetection layer 150, and on an exposed surface of the second photodetection layer 150. The filter layer 701 may be defined as a structure that includes at least one of an insulator, dielectric, and a metal material. For example, the filter layer 701 may include at least one of a substrate formed as the insulator or the dielectric and a metal layer formed on at least one of both surfaces of the substrate separate along the one axis X.

According to the second example embodiments, the filter layer 701 may be provided in various structures. According to an example embodiment, if a thickness is defined in a direction parallel to the one axis X, the filter layer 701 may have a uniform thickness and the thickness may increase as getting closer to another side of the filter layer 701 from one side thereof. For example, the thickness of the substrate in the filter layer 701 may become thicker from the one side of the filter layer 701 to the other side thereof, which may cause the metal layer to be tilted from the one axis X and a plane perpendicular to the one axis X. According to another example embodiment, the filter layer 701 may include at least one slit configured to pass through at least one of the substrate and the metal layer of the filter layer 701 in a direction parallel to the one axis X and to extend in a direction perpendicular to the one axis X. According to another example embodiment, the filter layer 701 may include a plurality of holes configured to penetrate at least one of the substrate and the metal layer of the filter layer 701 in a direction parallel to the one axis X. The plurality of holes may be uniformly arranged in the filter layer 701 in a direction perpendicular to the one axis X. For example, if cross-sections of the holes are defined in a direction perpendicular to the one axis X, the cross-sections of the holes may be in at least one of a circular shape, a polygonal shape, and a cross shape. According to another example embodiment, the metal layer of the filter layer 701 may include a plurality of metal patterns. The plurality of metal patterns may be formed and arranged in a metamaterial structure.

FIGS. 8A and 8B, and 9A and 9B illustrate a method of fabricating the multicolor photodetector 700 according to the second example embodiments.

FIGS. 2A and 2B, 3, 4, 5A and 5B, 8A and 8B, and 9A and 9B, the multicolor photodetector 700 according to the second example embodiments may be fabricated based on a semiconductor fabrication scheme. That is, the integrated circuit device 110 including the ROIC may be prepared and the first photodetection layer 130, the second photodetection layer 150, and the filter layer 701 may be formed on the integrated circuit device 110. The integrated circuit device 110 may electrically connect to the first photodetection layer 130 and the second photodetection layer 150. Operations of the method of fabricating the multicolor photodetector 700 according to the second example embodiments corresponding to operations shown in FIGS. 2A and 2B, 3, 4, 5A and 5B are identical to those of the method of fabricating the multicolor photodetector 100 according to the first example embodiments. Therefore, further description related thereto is omitted here.

Figure 8A:
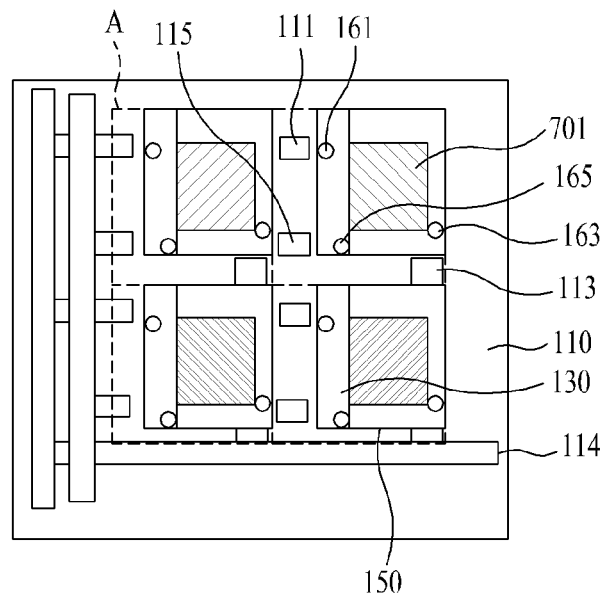
FIGS. 8A and 8B, and 9A and 9B illustrate a method of fabricating the multicolor photodetector according to the second example embodiments.
Figure 8B:
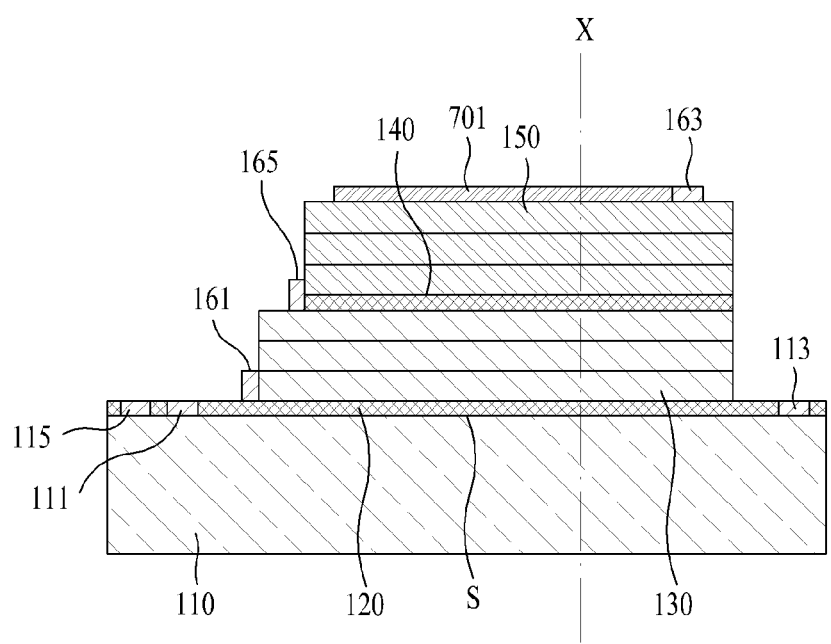
Figure 9A:
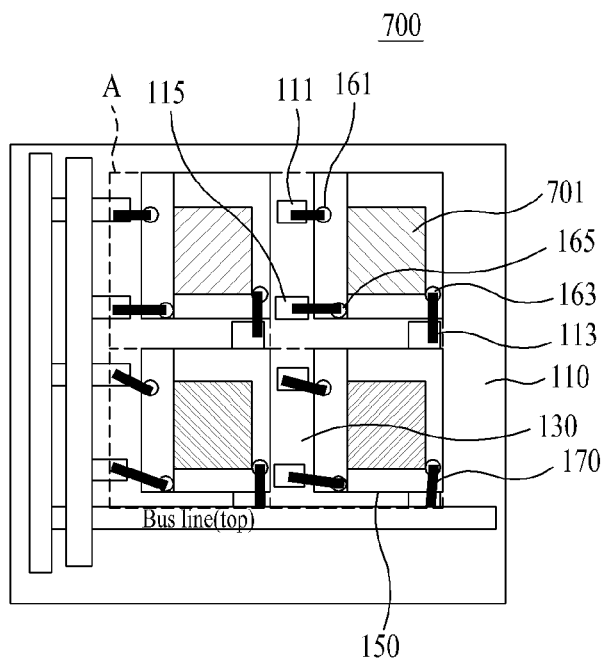
Figure 9B:
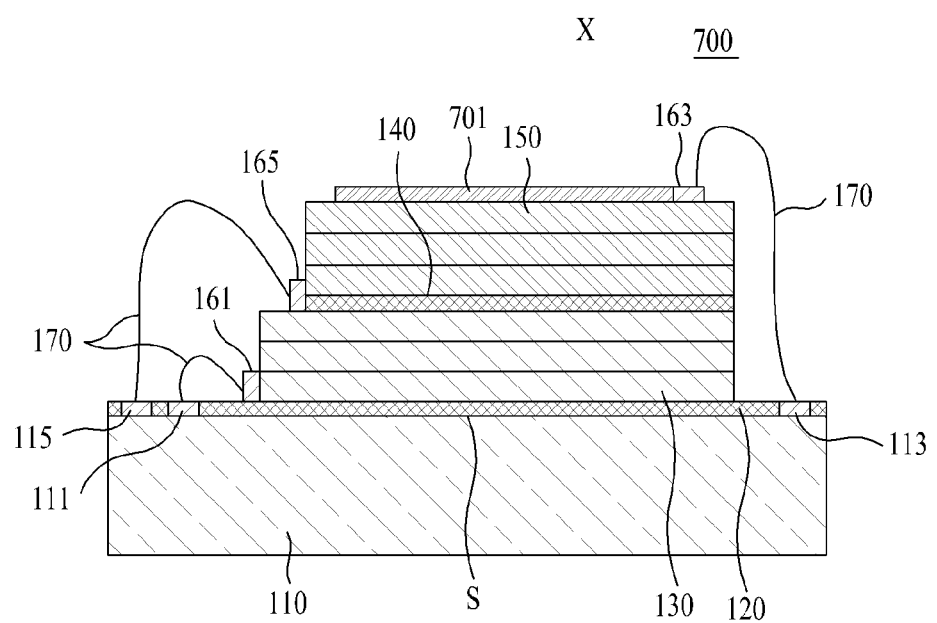

Referring to FIGS. 8A and 8B, each filter layer 701 may be formed to correspond to each corresponding photodetection device. After defining each photodetection device by cutting the assembly as shown in FIGS. 5A and 5B, each filter layer 701 may be formed in each corresponding photodetection device. Here, each filter layer 701 may be stacked on the second photodetection layer 150.

According to another example embodiment, before defining each photodetection device by cutting the assembly as shown in FIGS. 5A and 5B, each filter layer 701 may be formed in each corresponding photodetection device. After the integrated circuit device 110 is provided as shown in FIGS. 2A and 2B, each filter layer 701 may be formed on the one surface S of the integrated circuit device 110. Alternatively, when the first photodetection layer 130 is formed on the one surface S of the integrated circuit device 110, each filter layer 701 may be stacked on the first photodetection layer 130. Alternatively, the assembly may be formed by sequentially stacking the first photodetection layer 130, the filter layer 701, and the second photodetection layer 150 and then may be attached on the one surface S of the integrated circuit device 110.

Referring to 9A and 9B, the integrated circuit device 110 and the respective photodetection devices may be electrically connected using the corresponding connecting members 170. Here, the first photodetection layer 130 and the second photodetection layer 150 may be electrically connected to the ROIC of the integrated circuit device 110 using the connecting members 170. The first electrode 161 and the first pad 111 may be connected, the second electrode 163 and the second pad 113 may be connected, and the third electrode 165 and the third pad 115 may be connected. Here, the connecting members 170 may include, for example, a metal wire.

Through this, the multicolor photodetector 700 according to the second example embodiments may be fabricated. In response to an operation of the multicolor photodetector 700, the filter layer 701 may selectively transmit light with a wavelength corresponding to a predetermined band from the incident light. In addition, the first photodetection layer 130 and the second photodetection layer 150 may detect the first wavelength light and the second wavelength light from the incident light, respectively. The first photodetection layer 130 and the second photodetection layer 150 may generate a sensing signal for the first wavelength light and the second wavelength light, respectively. The connecting members 170 may forward the sensing signal from the first photodetection layer 130 and the sensing signal from the second photodetection layer 150 to the ROIC of the integrated circuit device 110.

Here, to maximize the effect of the first photodetection layer 130, a thickness of the first photodetection layer 130 needs to increase. In detail, a thickness of an absorption layer provided between the n-type semiconductor layer and the p-type semiconductor layer in the first photodetection layer 130 needs to be greater than or equal to a wavelength to be absorbed in the first photodetection layer 130. Here, an increase in the thickness of the absorption layer may lead to making a process of fabricating the first photodetection layer 130 become complex and increasing cost. Likewise, to maximize the effect of the second photodetection layer 150, a thickness of the second photodetection layer 150 needs to increase. In detail, a thickness of an absorption layer provided between the p-type semiconductor layer and the n-type semiconductor layer in the second photodetection layer 150 needs to be greater than or equal to a wavelength to be absorbed in the second photodetection layer 150. Here, an increase in the thickness of the absorption layer may lead to making a process of fabricating the second photodetection layer 150 become complex and increasing cost.

Figure 10:
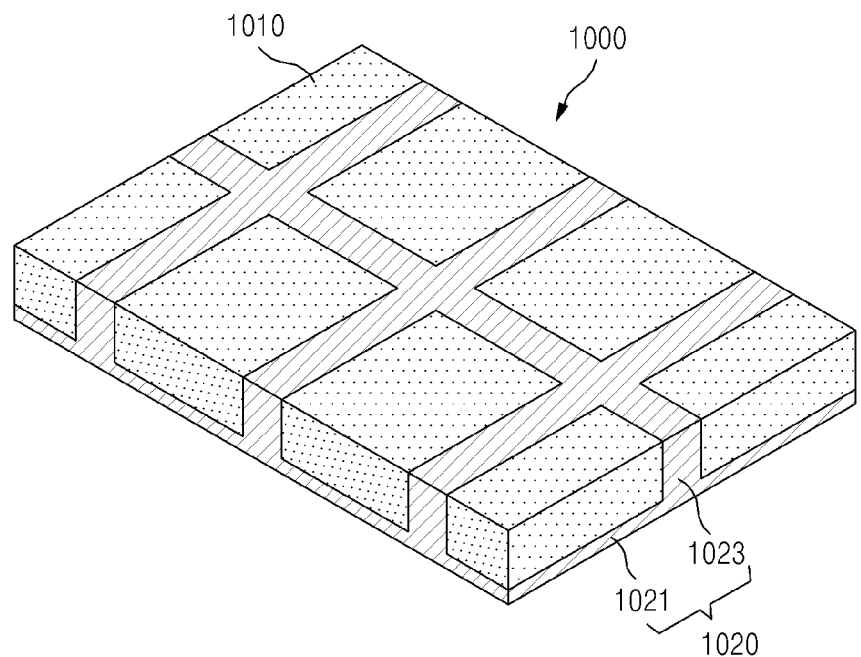
FIGS. 10 and 11 illustrate examples of a periodic structure applicable to a multicolor photodetector according to various example embodiments.
Figure 11:
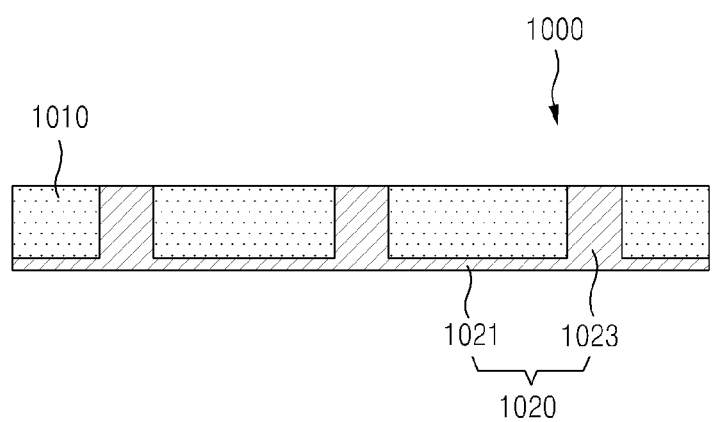

FIGS. 10 and 11 illustrate examples of a periodic structure 1000 applicable to the multicolor photodetectors 100 and 700 according to various example embodiments. Here, FIG. 10 is a perspective view of the periodic structure 1000 and FIG. 11 is a cross-sectional view of the periodic structure 1000.

Referring to FIGS. 10 and 11, the multicolor photodetector 100, 700 according to various example embodiments may further include at least one periodic structure 1000. The periodic structure 1000 may include a base area 1010 and a mirror area 1020.

The base area 1010 may support the mirror area 1020. The base area 1010 may include a dielectric material. For example, the dielectric material may include at least one of $SiO_2$, $TiO_2$, and $SiN_x$. For example, the base area 1010 may include the same material as that of at least one of the first attachment layer 120 and the second attachment layer 140. As another example, the base area 1010 may include a material different from that of the first attachment layer 120 and the second attachment layer 140.

The mirror area 1020 may be formed in a periodic pattern. The mirror area 1020 may include at least one of a first mirror area 1021 and a second mirror area 1023. The first mirror area 1021 may support at least one of the second mirror area 1023 and the base area 1010. For example, the first mirror area 1021 may be formed in a planar form. The second mirror area 1023 may be formed in a periodic pattern. The second mirror area 1023 may be disposed on the first mirror area 1021 or may insert into the base area 1010 in the periodic pattern. For example, the periodic pattern may be in a lattice structure. The mirror area 1020 may include a metal material. For example, the metal material may include at least one of Au and Ag.

According to an example embodiment, the periodic structure 1000 may be provided between the integrated circuit device 110 and the first photodetection layer 130. For example, instead of the first attachment layer 120, the periodic structure 1000 alone may be provided between the integrated circuit device 110 and the first photodetection layer 130. As another example, the periodic structure 1000 may be provided between the integrated circuit device 110 and the first attachment layer 120 or between the first attachment layer 120 and the first photodetection layer 130. Here, the mirror area 1020 may induce a lattice mode resonance, that is, a guided-mode resonance with respect to vertically incident light and may guide the incident light to horizontally progress. Through this, the first photodetection layer 130 may absorb light during a sufficient amount of time. That is, as the reflection efficiency increases using the periodic structure 1000, the efficiency of the first photodetection layer 130 may be maximized. Although the absorption layer provided between the n-type semiconductor layer and the p-type semiconductor layer in the first photodetection layer 130 has a relatively thin thickness, the efficiency of the first photodetection layer 130 may be maximized by the periodic structure 1000. Here, the periodic structure 1000 may allow broadband absorption of the first photodetection layer 130 and loss may be compensated since the absorption layer of the first photodetection layer 130 is formed with the relatively thin thickness.

According to another example embodiment, the periodic structure 1000 may be provided between the first photodetection layer 130 and the second photodetection layer 150. For example, instead of the second attachment layer 140, only the periodic structure 1000 may be provided between the first photodetection layer 130 and the second photodetection layer 150. As another example, the periodic structure 1000 may be provided between the first photodetection layer 130 and the second attachment layer 140 or between the second attachment layer 140 and the second photodetection layer 150. Here, the mirror area 1020 may induce a lattice mode resonance, that is, a guided-mode resonance with respect to vertically incident light and may guide the light to horizontally progress. Through this, the second photodetection layer 150 may absorb light during a sufficient amount of time. That is, as the reflection efficiency increases using the periodic structure 1000, the efficiency of the second photodetection layer 150 may be maximized. Although the absorption layer provided between the p-type semiconductor layer and the n-type semiconductor layer in the second photodetection layer 150 has a relatively thin thickness, the efficiency of the second photodetection layer 150 may be maximized by the periodic structure 1000. Here, the periodic structure 1000 may allow broadband absorption of the second photodetection layer 150 and loss may be compensated since the absorption layer of the second photodetection layer 150 is formed with the relatively thin thickness.

According to another example embodiment, the periodic structures 1000 may be provided between the integrated circuit device 110 and the first photodetection layer 130 and between the first photodetection layer 130 and the second photodetection layer 150, respectively. Through this, as the reflection efficiency increases using the periodic structures 1000, the efficiency of the first photodetection layer 130 and the second photodetection layer 15 may be maximized by the periodic structures 1000. Here, the periodic structures 1000 may allow broadband absorption of the first photodetection layer 130 and the second photodetection layer 150 and loss occurring in the first photodetection layer 130 and the second photodetection layer 150 may be compensated.

Figure 12A:
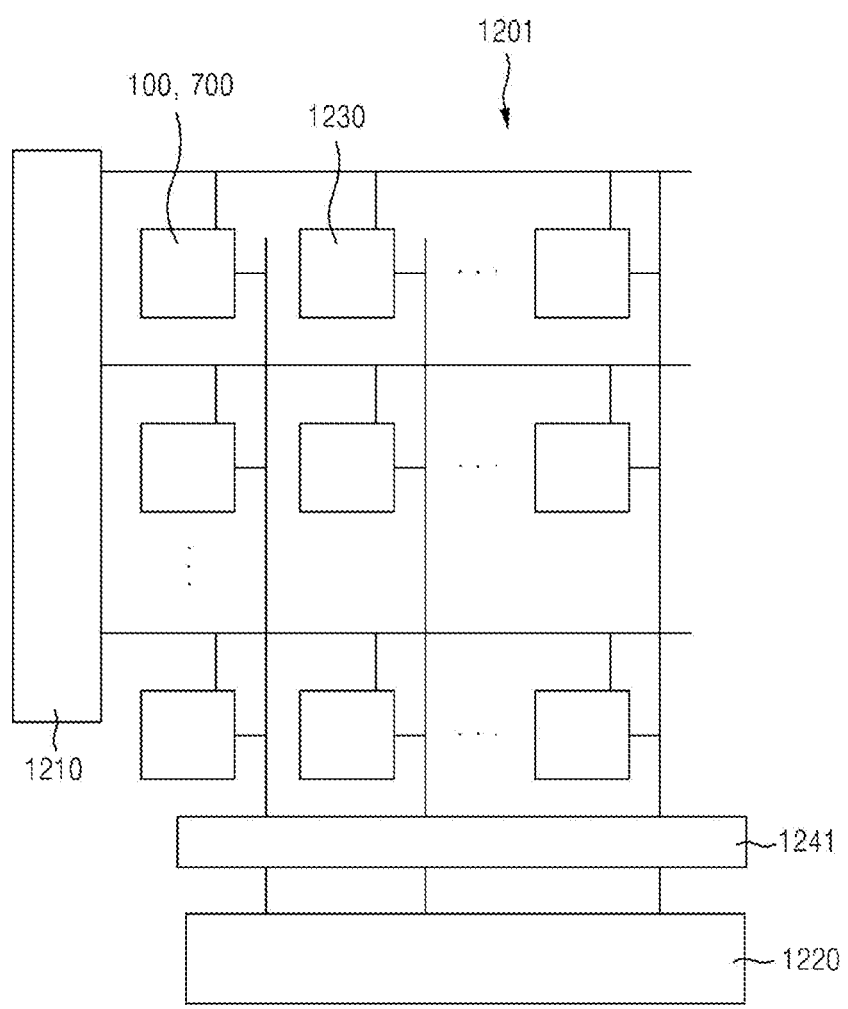
FIGS. 12A and 12B illustrate examples of a readout integrated circuit (ROIC) device using a multicolor photodetector according to example embodiments.
Figure 12B:
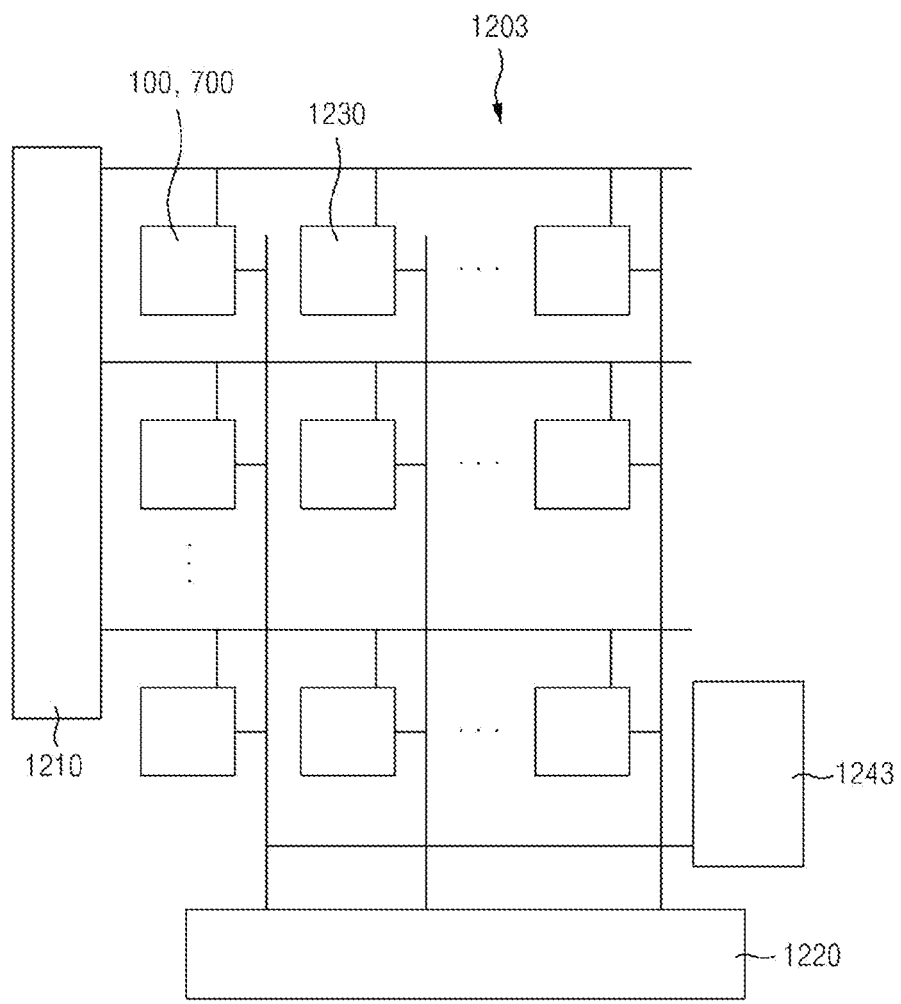

FIGS. 12A and 12B illustrate examples of a ROIC device 1201, 1203 using the multicolor photodetector 100, 700 according to various example embodiments. For example, the ROIC device 1201, 1203 may be for an image sensor of an active pixel sensor (APS) type.

Referring to FIGS. 12A and 12B, the ROIC device 1201, 1203 may couple with a plurality of multicolor photodetectors 100, 700. The ROIC device 1201, 1203 may be configured to implement an image based on a signal output from at least one of the multicolor photodetectors 100, 700. For example, the multicolor photodetectors 100, 700 may share a single integrated circuit device 110, and the ROIC device 1201, 1203 may be provided on the integrated circuit device 110. As another example, the ROIC device 1201, 1203 may be configured on a separate substrate (not shown) and the multicolor photodetectors 100, 700 may be mounted on the substrate. The ROIC device 1201, 1203 may include at least one of a decoder 1210, a multiplexer 1220, a plurality of amplifiers 1230, and an analog-to-digital converter 1241, 1243.

Each of the multicolor photodetectors 100, 700 may be connected to the decoder 1210 and the multiplexer 1220. According to an example embodiment, the decoder 1210 may be a row decoder and the multiplexer 1220 may be a column multiplexer. According to another example embodiment, the decoder 1210 may be a column decoder and the multiplexer 1220 may be a row multiplexer. According to some example embodiments, each of the amplifiers 1230 may be connected to each corresponding multicolor photodetector 100, 700 and the multiplexer 1220. Here, each multicolor photodetector 100, 700 may output an analog signal.

The analog-to-digital converter 1241, 1243 may convert an analog signal output from at least one multicolor photodetector 100, 700 to a digital signal. For example, referring to FIG. 12A, the analog-to-digital converter 1241 may be provided at a front end of the multiplexer 1220. Here, the analog-to-digital converter 1241 may be provided between the multicolor photodetectors 100, 700 and the multiplexer 1220. As another example, referring to FIG. 12B, the analog-to-digital converter 1243 may be connected at the front end of the multiplexer 1220. Here, the analog-to-digital converter 1243 may be connected between the multicolor photodetectors 100, 700 and the multiplexer 1220.

Through this, the ROIC device 1201, 1203 may select at least one of the multicolor photodetectors 100, 700 and may drive the selected multicolor photodetector 100, 700. The ROIC device 1201, 1203 may implement an image based on a signal output from the selected multicolor photodetector 100, 700. Here, an analog signal may be output from the selected multicolor photodetector 100, 700. The analog-to-digital converter 1241, 1243 may convert the analog signal output from the selected multicolor photodetector 100, 700 to a digital signal. Here, if a plurality of multicolor photodetectors 100, 700 is selected, the analog-to-digital converter 1241, 1243 may couple analog signals output from the selected multicolor photodetectors 100, 700 and may convert the coupled analog signal to a digital signal. Accordingly, the ROIC device 1201, 1203 may implement an image using the digital signal output from the analog-to-digital converter 1241, 1243.

Figure 13:
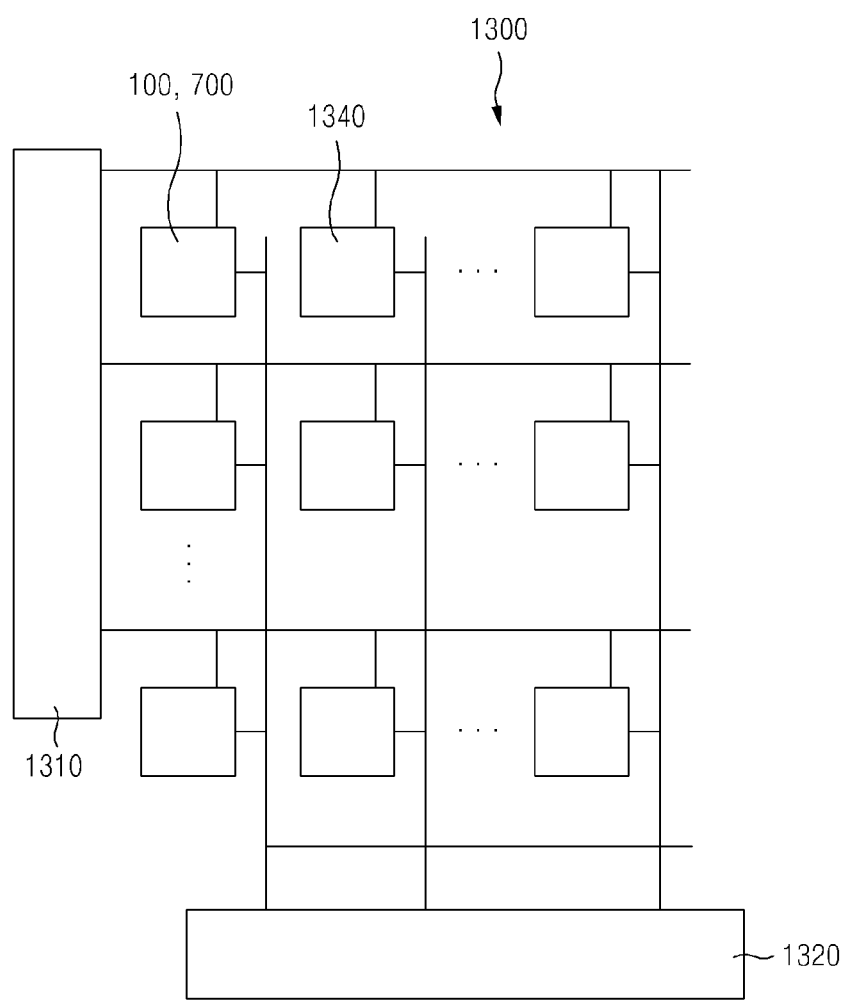
FIG. 13 illustrates another example of a ROIC device using a multicolor photodetector according to various example embodiments.

FIG. 13 illustrates another example of a ROIC device 1300 using the multicolor photodetector 100, 700 according to various example embodiments. For example, the ROIC device 1300 may be an image sensor of a digital pixel sensor (DPS) type.

Referring to FIG. 13, the ROIC device 1300 may couple with a plurality of multicolor photodetectors 100, 700. The ROIC device 1300 may implement an image based on a signal output from at least one of the multicolor photodetectors 100, 700. For example, the multicolor photodetectors 100, 700 may share a single integrated circuit device 110, and the ROIC device 1300 may be configured on the integrated circuit device 110. As another example, the ROIC device 1300 may be configured on a separate substrate (not shown) and the multicolor photodetectors 100, 700 may be mounted on the substrate. The ROIC device 1300 may include at least one of a decoder 1310, a multiplexer 1320, and a plurality of analog-to-digital converters 1340.

Each of the multicolor photodetectors 100, 700 may be connected to the decoder 1310 and the multiplexer 1320. According to an example embodiment, the decoder 1310 may be a row decoder and the multiplexer 1320 may be a column multiplexer. According to another example embodiment, the decoder 1310 may be a column decoder and the multiplexer 1320 may be a row multiplexer. Here, the multicolor photodetectors 100, 700 may output analog signals.

The analog-to-digital converters 1340 may convert the analog signals output from the multicolor photodetectors 100, 700 to digital signals, respectively. Here, each of the analog-to-digital converters 1340 may be connected to each corresponding multicolor photodetector 100, 700 and the multiplexer 1320.

Through this, the ROIC device 1300 may select at least one of the multicolor photodetectors 100, 700, and may drive the selected multicolor photodetector 100, 700. The ROIC device 1300 may implement an image based on a signal output from the selected multicolor photodetector 100, 700. Here, an analog signal may be output from the selected multicolor photodetector 100, 700. At least one analog-to-digital converter 1340 connected to the selected multicolor photodetector 100, 700 may convert the analog signal output from the selected multicolor photodetector 100, 700 to a digital signal. Here, if a plurality of multicolor photodetectors 100, 700 is selected, the plurality of analog-to-digital converters 1340 may convert analog signals output from the selected multicolor photodetectors 100, 700 to digital signals, respectively. Accordingly, the ROIC device 1300 may implement an image using the digital signal output from the at least one analog-to-digital converter 1340.

Figure 14:
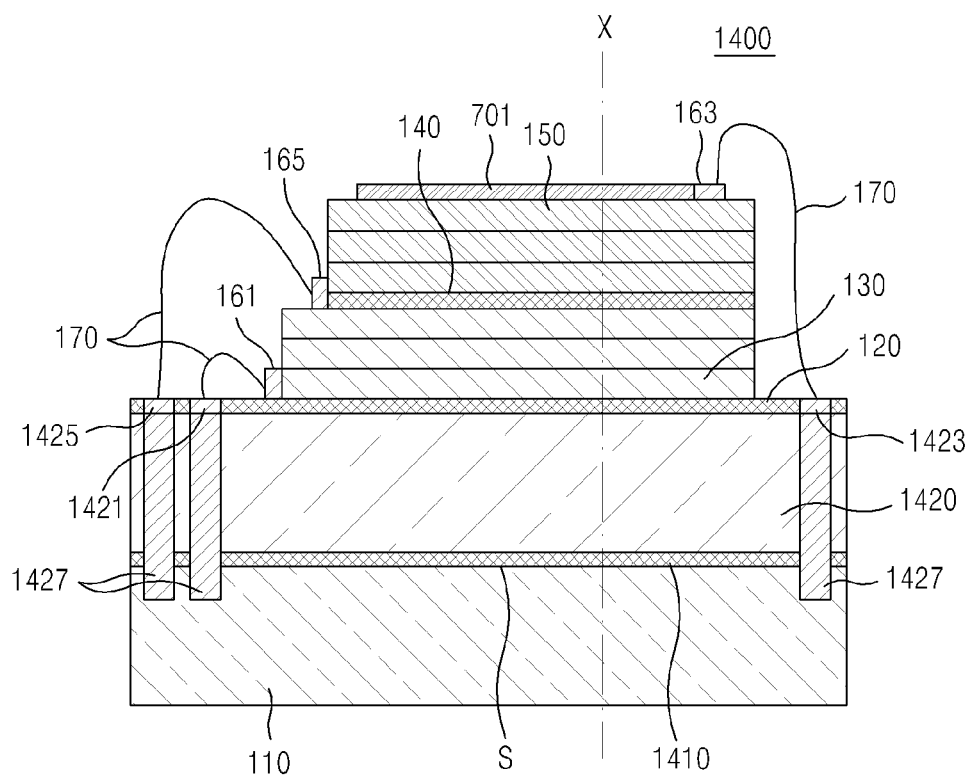
FIG. 14 is a cross-sectional view illustrating an example of an image sensor using a multicolor photodetector according to various example embodiments.

FIG. 14 is a cross-sectional view illustrating an example of an image sensor 1400 using the multicolor photodetector 100, 700 according to various example embodiments.

Referring to FIG. 14, the image sensor 1400 may include at least one of the multicolor photodetector 100, 700, a device attachment layer 1410, and a memory device 1420.

The device attachment layer 1410 may be formed on the integrated circuit device 110. The device attachment layer 1410 may attach the memory device 1420 to the integrated circuit device 110. To this end, the device attachment layer 1410 may be provided on the one surface S of the integrated circuit device 110.

The memory device 1420 may be provided between the integrated circuit device 110 and the first photodetection layer 130. The memory device 1420 may include a plurality of pads 1421, 1423, and 1425 and a plurality of via-patterns 1427. The pads 1421, 1423, and 1425 may be provided on one surface of the memory device 1420 and may be connected to the via-patterns 1427, respectively. Each of the via-patterns 1427 may pass through the memory device 1420 along the one axis X and may be connected to the ROIC of the integrated circuit device 110. For example, although not illustrated, the via-patterns 1427 may be connected to the pads 1421, 1423, and 1425 of the integrated circuit device 110, respectively.

For example, the memory device 1420 may include at least one of a volatile memory device and a non-volatile memory device. Here, the volatile memory device may include at least one of a static random access memory (SRAM) and a dynamic RAM (DRAM). For example, the memory device 1420 may be configured as a DRAM in which a p-type semiconductor layer is provided between two n-type semiconductor layers. That is, the p-type semiconductor layer may be stacked on a first n-type semiconductor layer and a second n-type semiconductor layer may be stacked on the p-type semiconductor layer. Here, a top metal layer may be stacked on a top layer, that is, the second n-type semiconductor layer and a bottom metal layer may be stacked on a bottom layer, that is, the first n-type semiconductor layer to be adjacent to the p-type semiconductor layer. At least one of the top metal layer and the bottom metal layer may include at least one of, for example, Ni and Au.

In this case, the first attachment layer 120 may attach the first photodetection layer 130 to the memory device 1420. Here, the first attachment layer 120 may expose the pads 1421, 1423, and 1425 on one surface of the memory device 1420. The connecting members 170 may connect the pads 1421, 1423, and 1425 of the memory device 1420 to the first electrode 161, the second electrode 163, and the third electrode 165, respectively.

Figure 15:
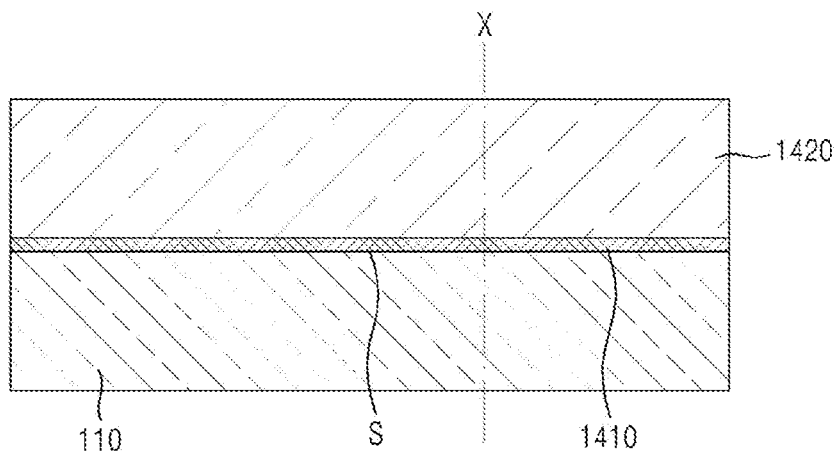
FIGS. 15 and 16 are cross-sectional views for describing a method of fabricating an image sensor using a multicolor photodetector according to various example embodiments.
Figure 16:
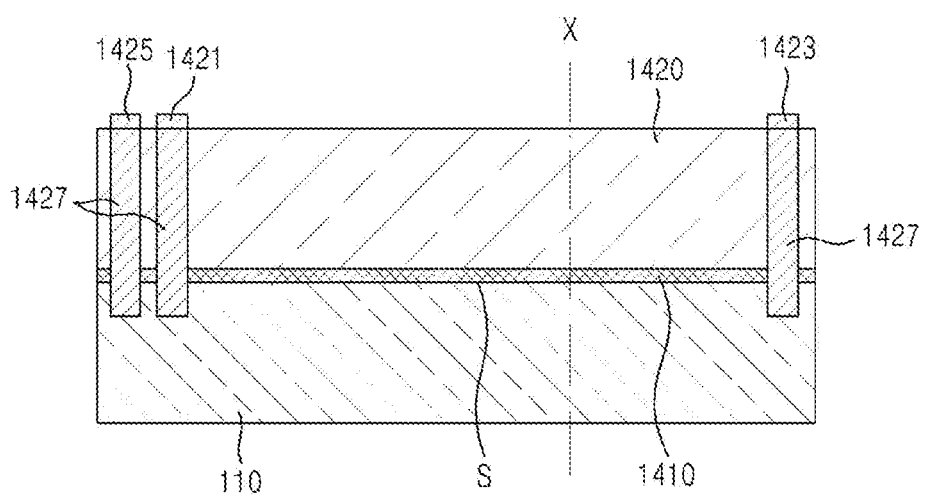

FIGS. 14, 15, and 16 are cross-sectional views for describing a method of fabricating the image sensor 1400 using the multicolor photodetector 100, 700 according to various example embodiments. The image sensor 1400 may be fabricated based on a semiconductor fabrication scheme. That is, the integrated circuit device 110 including the ROIC may be prepared, the memory device 1420 may be provided on the integrated circuit device 110, and the first photodetection layer 130 and the second photodetection layer 150 may be formed on the memory device 1420. Here, the integrated circuit device 110, the memory device 1420, the first photodetection layer 130, and the second photodetection layer 150 may be electrically connected.

Referring to FIG. 15, the memory device 1420 may be stacked on the integrated circuit device 110. To this end, each of the integrated circuit device 110 and the memory device 1420 may be prepared. Here, each of the integrated circuit device 110 and the memory device 1420 may be provided as a wafer. The device attachment layer 1410 may be formed on the one surface S of the integrated circuit device 110. Through this, the memory device 1420 may be attached on the one surface S of the integrated circuit device 110 through the device attachment layer 1410.

Referring to FIG. 16, the memory device 1420 may be electrically connected to the integrated circuit device 110. Here, the via-patterns 1427 may be formed in the memory device 1420. For example, a plurality of via-holes that passes through the memory device 1420 along the one axis X may be formed and metal materials may fill in the via-holes. Through this, the via-patterns 1427 may be formed. Each of the via-patterns 1427 may be connected to the ROIC of the integrated circuit device 110. The pads 1421, 1423, and 1425 may be formed on the memory device 1420. Each of the pads 1421, 1423, and 1425 may be provided on one surface of the memory device 1420. Here, the pads 1421, 1423, and 1425 may be connected to the via-patterns 1427, respectively.

Operations described above with FIGS. 3, 4, 5A and 5B, and 8A and 8B may be performed. The first attachment layer 120 may be formed on the memory device 1420, and the first photodetection layer 130 may be stacked on the memory device 1420 through the first attachment layer 120. Here, the first attachment layer 120 may expose the pads 1421, 1423, and 1425 on the one surface of the memory device 1420.

The memory device 1420 and the respective photodetection devices may be electrically connected using the respective corresponding connecting members 170. Here, the first photodetection layer 130 and the second photodetection layer 150 may be electrically connected to the memory device 1420 and the ROIC of the integrated circuit device 110 using the connecting members 170. The first electrode 161 and the first pad 1421 may be connected, the second electrode 163 and the second pad 1423 may be connected, and the third electrode 165 and the third pad 1425 may be connected. Here, the connecting members 170 may include, for example, a metal wire.

The multicolor photodetector 100, 700 according to various example embodiments may include the integrated circuit device 110 in which the ROIC is wired, at least one photodetection device including the first photodetection layer 130 provided on the integrated circuit device 110 and configured to detect the first wavelength light from the incident light, and the second photodetection layer 150 stacked on the first photodetection layer 130 and configured to detect the second wavelength light from the incident light, and the connecting members 170 configured to electrically connect the first photodetection layer 130 and the second photodetection layer 150 to the ROIC.

According to various example embodiments, the photodetection device may further include the filter layer 701 configured to transmit a predetermined band from the incident light.

According to various example embodiments, the filter layer 701 may be stacked at least one of between the integrated circuit device 110 and the first photodetection layer 130, between the first photodetection layer 130 and the second photodetection layer 150, and on the second photodetection layer 150.

According to various example embodiments, the photodetection device may further include the periodic structure 1000 provided at least one of between the integrated circuit device 110 and the first photodetection layer 130 and between the first photodetection layer 130 and the second photodetection layer 150 and including the base area 1010 and the mirror area 1020 formed on the base area 1010 in a periodic pattern.

According to various example embodiments, the multicolor photodetector 100, 700 may connect to the analog-to-digital converter 1241, 1243, 1340 that is provided on the integrated circuit device 110 and is configured to convert an analog signal output from the multicolor photodetector 100, 700 to a digital signal.

According to various example embodiments, the multicolor photodetector 100, 700 may further include the memory device 1420 provided between the integrated circuit device 110 and the photodetection device, and configured to electrically connect to the integrated circuit device 110 and the photodetection device.

According to various example embodiments, the photodetection device may be formed by forming the first photodetection layer 130 on the integrated circuit device 110 and by stacking the second photodetection layer 150 on the first photodetection layer 130.

According to various example embodiments, the photodetection device may include the first electrode 161 of the first photodetection layer 130, the second electrode 163 of the second photodetection layer 150, and the third electrode 165 shared between the first photodetection layer 130 and the second photodetection layer 150.

According to various example embodiments, the integrated circuit device 110 may include a plurality of pads 111, 113, and 115 connected to the ROIC, provided on the one surface S, and configured to connect to the first electrode 161, the second electrode 163, and the third electrode 165 through the connecting members 170, respectively.

According to various example embodiments, the memory device 1420 may include a plurality of pads 1421, 1423, and 1425 connected to the ROIC and configured to connect to the first photodetection layer 130 and the second photodetection layer 150 through the connecting members 170, respectively.

According to various example embodiments, the integrated circuit device 110 may be divided into a plurality of pixel areas arranged in a pixel structure and each to which the photodetection device is mounted.

According to various example embodiments, the photodetection device may further include the first attachment layer 120 provided between the integrated circuit device 110 and the photodetection device and configured to attach the first photodetection layer 130 on the one surface S.

According to various example embodiments, the photodetection device may further include the second attachment layer 140 provided between the first photodetection layer 130 and the second photodetection layer 150 and configured to attach the first photodetection layer 130 and the second photodetection layer 150.

According to various example embodiments, the connecting members 170 may include, for example a metal wire.

According to various example embodiments, a plurality of photodetection devices may be arranged in a pixel structure.

A method of fabricating the multicolor photodetector 100, 700 according to various example embodiments may include providing the integrated circuit device 110 in which the ROIC is wired, forming the assembly in which the first photodetection layer 130 for detecting the first wavelength light from the incident light and the second photodetection layer 150 for detecting the second wavelength light from the incident light are stacked on the integrated circuit device 110, and electrically connecting the first photodetection layer 130 and the second photodetection layer 150 to the ROIC using the connecting members 170.

According to various example embodiments, the forming of the assembly may include forming the filter layer 701 configured to transmit a predetermined band from the incident light.

According to various example embodiments, the forming of the filter layer 701 may include forming the filter layer 701 at least one of between the integrated circuit device 110 and the first photodetection layer 130, between the first photodetection layer 130 and the second photodetection layer 150, and on the second photodetection layer 150.

According to various example embodiments, the forming of the assembly may include forming the periodic structure 1000 including the base area 1010 and the mirror area 1020 formed in a periodic pattern on the base area 1010, at least one of between the integrated circuit device 110 and the first photodetection layer 130 and between the first photodetection layer 130 and the second photodetection layer 150.

According to various example embodiments, the multicolor photodetector 100, 700 may connect to the analog-to-digital converter 1241, 1243, 1340 that is provided on the integrated circuit device 110 and is configured to convert an analog signal output from the multicolor photodetector 100, 700 to a digital signal.

According to various example embodiments, the method of fabricating the multicolor photodetector 100, 700 may further include staking the memory device 1420 on the one surface S of the integrated circuit device 110 for electrical connection to the ROIC.

According to various example embodiments, the forming of the assembly may include forming the assembly on one surface of the memory device 1420.

According to various example embodiments, the forming of the assembly may include forming the first photodetection layer 130 on the integrated circuit device 110 and stacking the second photodetection layer 150 on the first photodetection layer 130.

According to various example embodiments, the assembly may include the first electrode 161 of the first photodetection layer 130, the second electrode 163 of the second photodetection layer 150, and the third electrode 165 shared between the first photodetection layer 130 and the second photodetection layer 150.

According to various example embodiments, the integrated circuit device 110 may include the plurality of pads 111, 113, and 115 connected to the ROIC and provided on the one surface S and configured to connect to the first electrode 161, the second electrode 163, and the third electrode 165 through the connecting members 170.

According to various example embodiments, the memory device 1420 may include the plurality of pads 1421, 1423, and 1425 configured to connect to the ROIC and to connect to the first photodetection layer 130 and the second photodetection layer 150 through the connecting members 170, respectively.

According to various example embodiments, the integrated circuit device 110 may be divided into a plurality of pixel areas arranged in the pixel structure.

According to various example embodiments, the method of fabricating the multicolor photodetector 100, 700 may further include cutting the first photodetection layer 130 and the second photodetection layer 150 between the pixels areas and segmenting the first photodetection layer 130 and the second photodetection layer 150 to correspond to the pixel areas.

According to various example embodiments, the forming of the assembly may include forming the first attachment layer 120 on the integrated circuit device 110 and attaching the assembly to the first attachment layer 120.

According to various example embodiments, the forming of the first photodetection layer 130 may include forming the first attachment layer 120 on the integrated circuit device 110 and attaching the first photodetection layer 130 to the first attachment layer 120.

According to various example embodiments, the stacking of the second photodetection layer 150 may include forming the second attachment layer 140 on the first photodetection layer 130 and attaching the second photodetection layer 150 to the second attachment layer 140.

According to various example embodiments, the connecting members 170 may include, for example, a metal wire.

According to various example embodiments, the multicolor photodetector 100, 700 may be implemented by coupling the first photodetection layer 130 and the second photodetection layer 150 on the integrated circuit device 110. Through this, a structure of the first photodetection layer 130 and the second photodetection layer 150 may be simplified. Here, the first photodetection layer 130 and the second photodetection layer 150 may be formed on the integrated circuit device 110 based on a semiconductor fabrication scheme. Through this, a method of fabricating the multicolor photodetector 100, 700 may be simplified. Accordingly, the multicolor photodetector 100, 700 may be easily fabricated. In addition, the first photodetection layer 130 and the second photodetection layer 150 are cut on the integrated circuit device 110 and may be accurately arranged based on a pixel structure accordingly. The operation accuracy of the multicolor photodetector 100, 700 may be enhanced. Depending on example embodiments, the multicolor photodetector 700 may include the filter layer 701. Accordingly, the multicolor photodetector 700 may have the wavelength selectivity.

The terms used herein are used to explain specific embodiments and are not construed to limit the disclosure and should be understood to include various modifications, equivalents, and/or substitutions of the example embodiments. In the drawings, like reference numerals refer to like components throughout the present specification. The singular forms "a," "an," and "the" are intended to include the plural forms as well, unless the context clearly indicates otherwise. Herein, the expressions, "A or B," "at least one of A and/or B," "A, B, or C," "at least one of A, B, and/or C," and the like may include any possible combinations of listed items. Terms "first," "second," etc., are used to describe various components and the components should not be limited by the terms. The terms are simply used to distinguish one component from another component. When a component, for example, a first component, is described to be "(functionally or communicatively) connected to" or "accessed to" another component, for example, a second component, the component may be directly connected to the other component or may be connected through still another component, for example, a third component.

The term "module" used herein may include a unit configured as hardware, software, or firmware, and may be interchangeably used with the terms "logic," "logic block," "part," "circuit," etc. The module may be an integrally configured part, a minimum unit that performs at least function, or a portion thereof. For example, the module may be configured as an application-specific integrated circuit (ASIC).

According to the example embodiments, each of the components (e.g., module or program) may include a singular object or a plurality of objects. According to the example embodiments, at least one of the components or operations may be omitted. Alternatively, at least one another component or operation may be added. Alternatively or additionally, a plurality of components (e.g., module or program) may be integrated into a single component. In this case, the integrated component may perform one or more functions of each of the components in the same or similar manner as it is performed by a corresponding component before integration. According to the example embodiments, operations performed by a module, a program, or another component may be performed in sequential, parallel, iterative, or heuristic manner. Alternatively, at least one of the operations may be performed in different sequence or omitted. Alternatively, at least one another operation may be added.

While this disclosure includes specific example embodiments, it will be apparent to one of ordinary skill in the art that various alterations and modifications in form and details may be made in these example embodiments without departing from the spirit and scope of the claims and their equivalents. For example, suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of fabricating a multicolor photodetector, the method comprising:
    providing an integrated circuit device in which a readout integrated circuit is wired;
    forming an assembly in which a first photodetection layer for detecting first wavelength light from incident light and a second photodetection layer for detecting second wavelength light from the incident light are formed on the integrated circuit device, wherein the first photodetection layer is positioned between the integrated circuit device and the second photodetection layer, and wherein the assembly also comprises:
    a first electrode of the first photodetection layer, wherein the first electrode is placed within a plane of the first photodetection layer;
    a second electrode of the second photodetection layer; and
    a third electrode shared between the first photodetection layer and the second photodetection layer;
    wherein each of the first electrode, the second electrode and the third electrode is configured to connect to the readout integrated circuit; and
    electrically connecting the first photodetection layer and the second photodetection layer to the readout integrated circuit using connecting members.

2. The method of claim 1, wherein the forming of the assembly comprises forming a filter layer configured to transmit a predetermined band from the incident light.

3. The method of claim 2, wherein the forming of the filter layer comprises:
    forming the filter layer at least one of between the integrated circuit device and the first photodetection layer, between the first photodetection layer and the second photodetection layer, and on the second photodetection layer.

4. The method of claim 1, wherein the forming of the assembly comprises:
    forming a periodic structure comprising a base area and a mirror area formed in a periodic pattern on the base area, at least one of between the integrated circuit device and the first photodetection layer and between the first photodetection layer and the second photodetection layer.

5. The method of claim 1, wherein the multicolor photodetector is configured to connect to an analog-to-digital converter that is provided on the integrated circuit device and is configured to convert an analog signal output from the multicolor photodetector to a digital signal.

6. The method of claim 1, further comprising:
    stacking a memory device on one surface of the integrated circuit device for electrical connection to the readout integrated circuit,
    wherein the forming of the assembly comprises forming the assembly on one surface of the memory device.

7. The method of claim 6, wherein the memory device comprises a plurality of pads configured to connect to the readout integrated circuit and to connect to the first photodetection layer and the second photodetection layer through the connecting members, respectively.

8. The method of claim 1, wherein the forming of the assembly comprises:
    forming the first photodetection layer on the integrated circuit device; and
    stacking the second photodetection layer on the first photodetection layer.

9. The method of claim 1, wherein the integrated circuit device is divided into a plurality of pixel areas arranged based on a pixel structure, and
    the method further comprises:
    cutting the first photodetection layer and the second photodetection layer between the pixel areas and segmenting the first photodetection layer and the second photodetection layer based on the pixel areas.

10. A multicolor photodetector comprising,
    an integrated circuit device in which a readout integrated circuit is wired;
    at least one photodetection device comprising a first photodetection layer provided on the integrated circuit device and configured to detect first wavelength light from incident light, and a second photodetection layer stacked on the first photodetection layer and configured to detect second wavelength light from the incident light, wherein the photodetection device further comprises:
    a first electrode of the first photodetection layer, wherein the first electrode is placed within a plane of the first photodetection layer;
    a second electrode of the second photodetection layer; and
    a third electrode shared between the first photodetection layer and the second photodetection layer; and
    connecting members configured to electrically connect the first photodetection layer and the second photodetection layer to the readout integrated circuit.

11. The multicolor photodetector of claim 10, wherein the photodetection device further comprises a filter layer configured to transmit a predetermined band from the incident light.

12. The multicolor photodetector of claim 11, wherein the filter layer is configured to be stacked at least one of between the integrated circuit device and the first photodetection layer, between the first photodetection layer and the second photodetection layer, and on the second photodetection layer.

13. The multicolor photodetector of claim 10, wherein the photodetection device further comprises:
    a periodic structure provided at least one of between the integrated circuit device and the first photodetection layer and between the first photodetection layer and the second photodetection layer and comprising a base area and a mirror area formed in a periodic pattern on the base area.

14. The multicolor photodetector of claim 10, wherein the multicolor photodetector is configured to connect to an analog-to-digital converter that is provided on the integrated circuit device and configured to convert an analog signal output from the multicolor photodetector to a digital signal.

15. The multicolor photodetector of claim 10, further comprising:
   a memory device provided between the integrated circuit device and the photodetection device, and configured to electrically connect to the integrated circuit device and the photodetection device.

16. The multicolor photodetector of claim 15, wherein the memory device comprises a plurality of pads configured to connect to the readout integrated circuit and to connect to the first photodetection layer and the second photodetection layer through the connecting members, respectively.

17. The multicolor photodetector of claim 10, wherein the photodetection device is formed by forming the first photodetection layer on the integrated circuit device, and by stacking the second photodetection layer on the first photodetection layer.

18. The multicolor photodetector of claim 10, wherein the integrated circuit device is divided into a plurality of pixel areas arranged in a pixel structure, and each to which the photodetection device is mounted.

* * * * *